(12) United States Patent
Wang et al.

(10) Patent No.: US 10,398,029 B2
(45) Date of Patent: Aug. 27, 2019

(54) HIGH-FREQUENCY TRANSFORMER

(71) Applicant: FUJI ELECTRIC CO., LTD., Kawasaki-shi, Kanagawa (JP)

(72) Inventors: Qichen Wang, Hino (JP); Satoru Fujita, Tachikawa (JP); Takashi Kuwabara, Hino (JP); Nobuyuki Tawada, Yokkaichi (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/583,967

(22) Filed: May 1, 2017

(65) Prior Publication Data

US 2017/0367184 A1 Dec. 21, 2017

(30) Foreign Application Priority Data

Jun. 16, 2016 (JP) ................................ 2016-120232

(51) Int. Cl.
| | |
|---|---|
| *H01F 5/02* | (2006.01) |
| *H01F 27/29* | (2006.01) |
| *H05K 1/18* | (2006.01) |
| *H01F 27/28* | (2006.01) |
| *H01F 27/32* | (2006.01) |
| *H05K 3/30* | (2006.01) |

(52) U.S. Cl.
CPC ............. *H05K 1/18* (2013.01); *H01F 27/28* (2013.01); *H01F 27/29* (2013.01); *H01F 27/325* (2013.01); *H05K 3/306* (2013.01); *H05K 2201/1003* (2013.01); *H05K 2201/10818* (2013.01)

(58) Field of Classification Search
CPC ........ H01F 5/02; H01F 5/06; H01F 2005/022; H01F 2005/025; H01F 2005/027; H01F 2005/046; H01F 27/325; H01F 27/28; H01F 27/29; H01F 27/2866; H01F 27/2832; H01F 27/323; H01F 27/324; H01F 27/327; H01F 27/08; H01F 27/2827; H01F 27/2847; H01F 27/2823; H01F 27/2828; H01F 27/2852; H05K 1/18; H01K 2201/1003
USPC .................. 336/212, 221, 198, 61, 179, 192
See application file for complete search history.

(56) References Cited

U.S. PATENT DOCUMENTS

| | | | |
|---|---|---|---|
| 6,310,533 B2 * | 10/2001 | Coulombier ............ | H01F 7/128 336/205 |
| 7,498,921 B1 * | 3/2009 | Wang ................... | H01F 27/2852 336/200 |
| 2010/0026437 A1 * | 2/2010 | Lin ...................... | H01F 27/2847 336/192 |

(Continued)

FOREIGN PATENT DOCUMENTS

| | | | |
|---|---|---|---|
| EP | 0973179 A1 * | 1/2000 | |
| JP | 2006-013094 A | 1/2006 | |

*Primary Examiner* — Mang Tin Bik Lian
(74) *Attorney, Agent, or Firm* — Rabin & Berdo, P.C.

(57) ABSTRACT

A transformer is configured to include a pair of cores and that each have an inner leg, wherein a primary winding that is wound around a bobbin having a hollow into which the inner legs of the cores and are inserted, and a secondary winding that has a hollow into which the inner legs of the cores and are inserted and that is constituted of a conductor formed by die-cutting a metal plate into a ring, are dispersedly arranged over the inner legs of the cores and. The bobbin has bobbin support portions that come into contact with a surface of a printed circuit board on which the transformer is implemented.

14 Claims, 8 Drawing Sheets

(56) References Cited

U.S. PATENT DOCUMENTS

| | | | | |
|---|---|---|---|---|
| 2011/0115598 A1* | 5/2011 | Wu | ...................... | H01F 27/325 |
| | | | | 336/212 |
| 2012/0154089 A1* | 6/2012 | Eom | ...................... | H01F 27/30 |
| | | | | 336/105 |
| 2014/0184378 A1* | 7/2014 | Wild | ........................ | H01F 5/02 |
| | | | | 336/207 |
| 2015/0318098 A1* | 11/2015 | Miyamoto | .............. | H01F 30/00 |
| | | | | 336/183 |

* cited by examiner

RELATED ART

FIG. 6

RELATED ART

F I G. 7

HIGH-FREQUENCY TRANSFORMER

CROSS-REFERENCE TO RELATED APPLICATIONS

This application is based upon and claims the benefit of priority of the prior Japanese Patent Application No. 2016-120232, filed on Jun. 16, 2016, the entire contents of which are incorporated herein by reference.

FIELD

The present invention relates to a high-frequency transformer applied to a power converter, and in particular relates to a configuration of a high-frequency transformer that is small and is able to output a high current.

BACKGROUND

Figure 6:
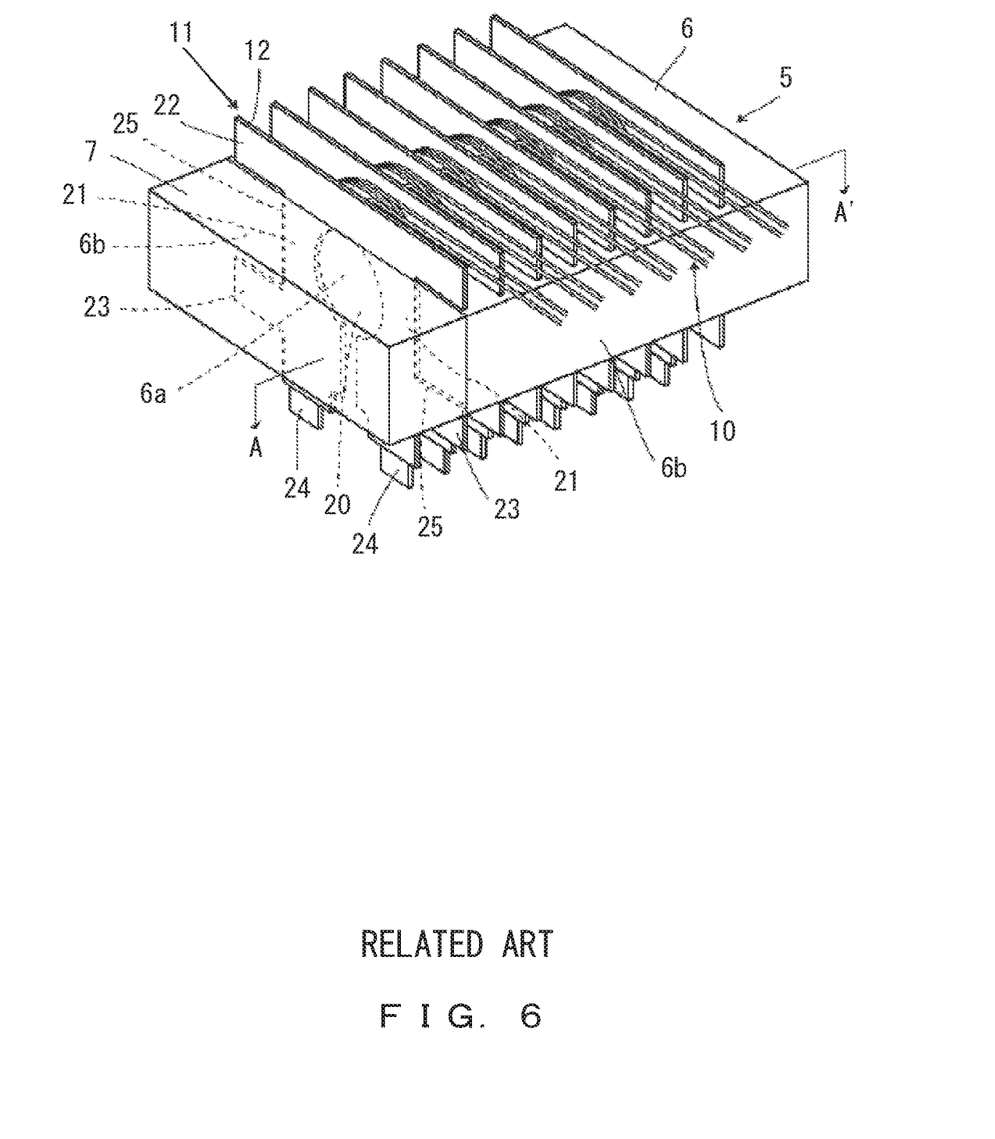
FIG. 6 illustrates a configuration of a transformer of Japanese Laid-open Patent Publication No. 2006-013094.

FIG. 6 illustrates a configuration of a transformer 5 disclosed in Japanese Laid-open Patent Publication No. 2006-013094. The transformer 5 includes a primary winding 10 configured by electrical wires and a secondary winding 11 configured by a metal plate-shaped member.

Then, the primary winding 10 and the secondary winding 11 are alternately implemented in a core inner leg 6a in order to provide a good magnetic coupling between the primary and secondary windings. As a result, there is no need for a bobbin.

Further, the secondary winding 11 is configured by a copper plate in order to deal with a high current, and is integrally provided with heat-releasing portions 22 and 23 that are pendent outside from a core 6. This permits an improvement in heat releasing in the secondary winding.

In the above-described transformer 5 illustrated in FIG. 6, leads 24 of the secondary winding 11 configured by a metal plate are directly soldered to a printed circuit board (not illustrated). In other words, the load of the transformer is supported by the leads 24 of the secondary winding 11.

When the above-described transformer 5 is driven at a high frequency, an effective thickness of a metal plate used for a secondary winding is about twice the skin depth with respect to the frequency, taking into consideration the influence of a skin effect. This makes it possible to make the secondary winding thinner. A transformer can be made smaller if a secondary winding is made thinner as described above.

Figure 7:
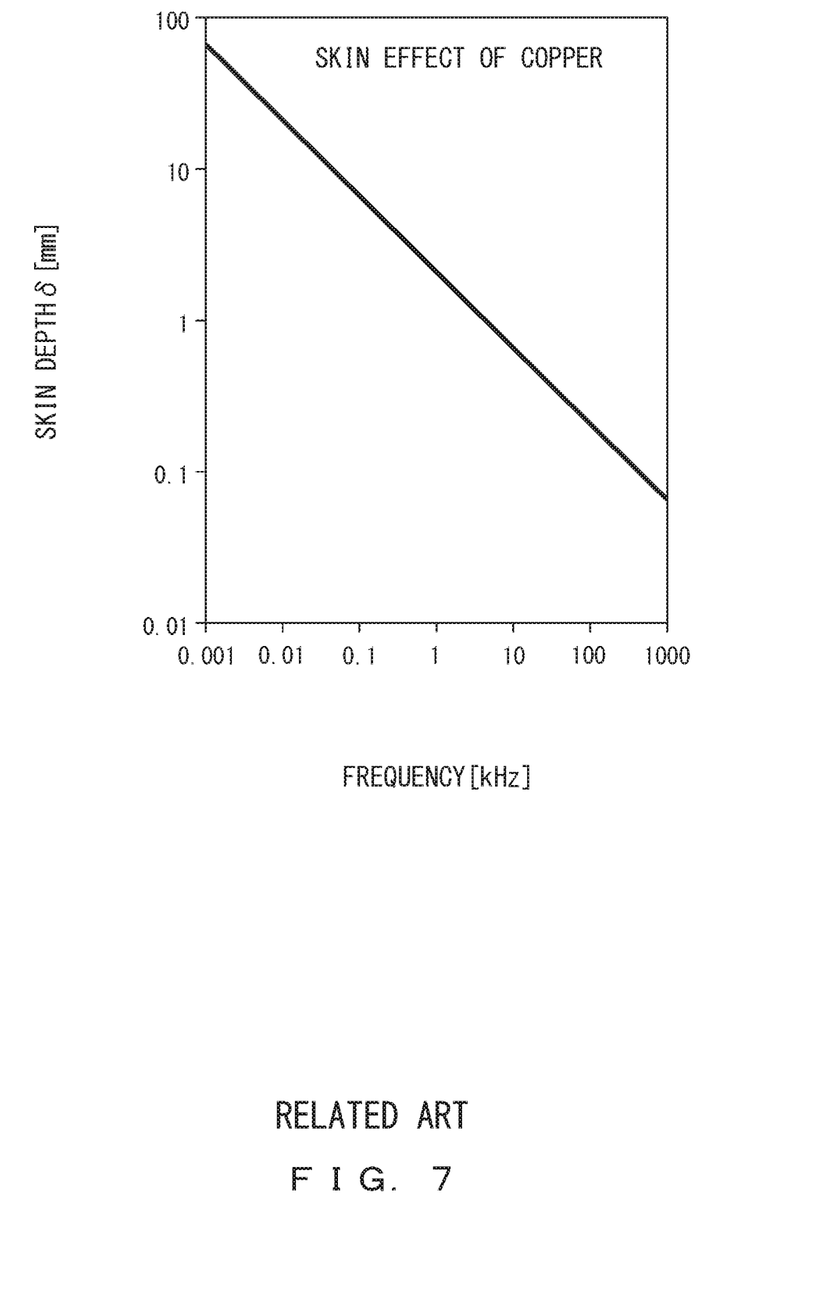
FIG. 7 illustrates a relationship between a frequency of operation and a skin depth in a metal plate (copper plate).

FIG. 7 illustrates a relationship between a frequency of operation and a skin depth in a metal plate (copper plate). As can be seen from the characteristics of a skin effect of copper illustrated in FIG. 7, the skin depth is 0.1 [mm] when a current of 500 [kHz] flows.

If a transformer having the above-described configuration is manufactured and operated under this condition, the transformer can be made smaller by configuring a secondary winding with a copperplate such that the thickness of the secondary winding is 0.2 [mm].

However, if the thickness of the secondary winding formed of copper plate is made thin, it will become difficult to support the transformer using the secondary winding soldered to a printed circuit board due to a decrease in strength.

SUMMARY

In order to solve the problem above, a high-frequency transformer according to an aspect of the present invention is implemented on a printed circuit board and includes a pair of cores that each include legs that configure a magnetic path, a primary winding and a secondary winding that are wound and provided in the legs, and a bobbin around which at least one of the primary winding and the secondary winding is wound, wherein the bobbin includes support portions that come into contact with the printed circuit board.

DESCRIPTION OF EMBODIMENTS

Embodiments of the present invention will now be described in detail.

Figure 1:
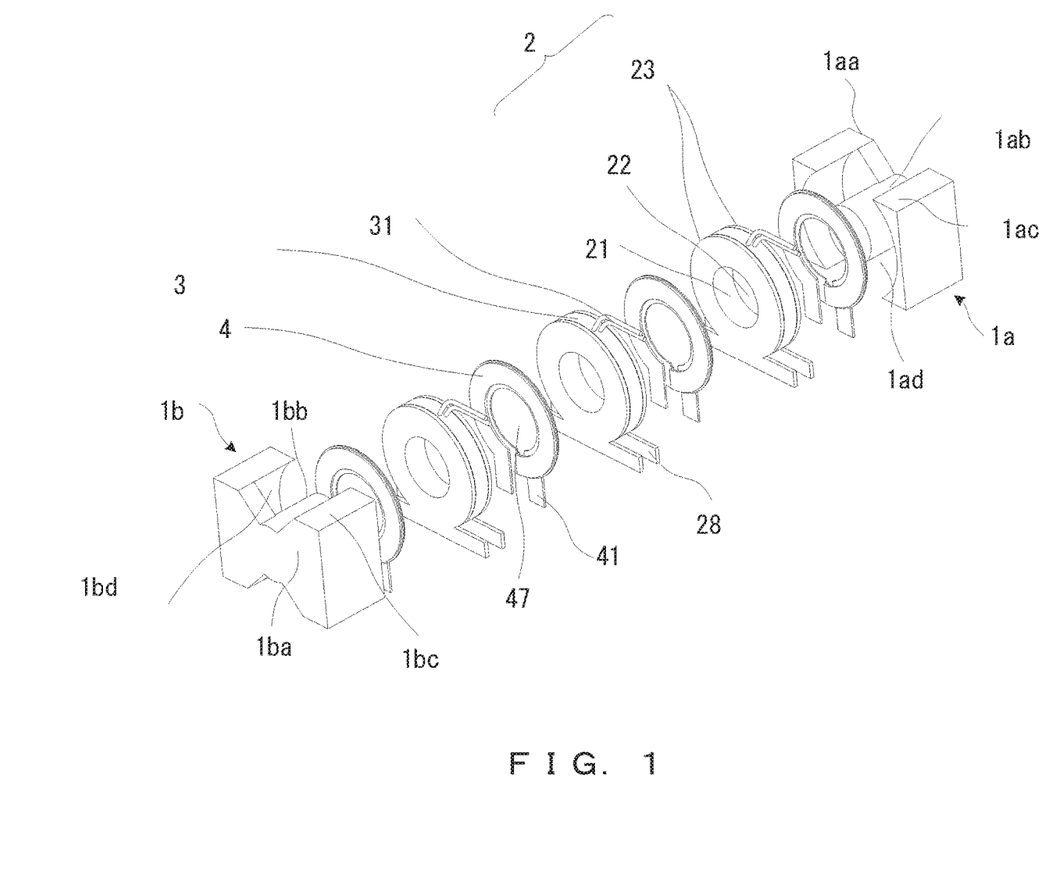
FIG. 1 is an exploded perspective view of a configuration of a high-frequency transformer according to embodiments of the present invention.
Figure 2:
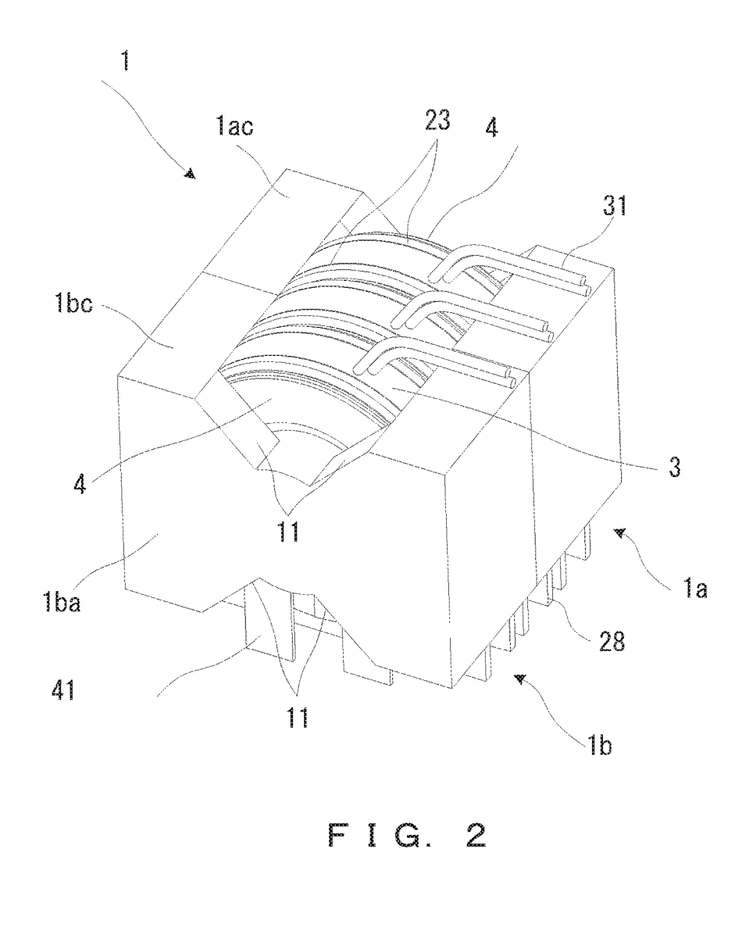
FIG. 2 is a perspective view of the assembled high-frequency transformer according to the embodiments of the present invention.

FIG. 1 is an exploded perspective view of a configuration of a high-frequency transformer according to embodiments of the present invention. FIG. 2 is a perspective view of the assembled high-frequency transformer according to the embodiments of the present invention. Using FIGS. 1 and 2, the configuration of the high-frequency transformer according to the embodiments of the present invention is described in detail. The high-frequency transformer will hereinafter also be referred to as a transformer.

The transformer illustrated in FIG. 1 (a transformer 1 illustrated in FIG. 2) is constituted of a pair of cores 1a and 1b, three primary windings 3, and four secondary windings 4.

The transformer 1 electrically insulates a high-voltage and high-frequency AC (Alternating Current) voltage applied to the primary winding 3, and outputs a low-voltage and high-frequency AC voltage to the secondary winding 4. Thus, a low current flows through the primary winding 3 and a high current flows through the secondary winding 4.

Figure 5A:
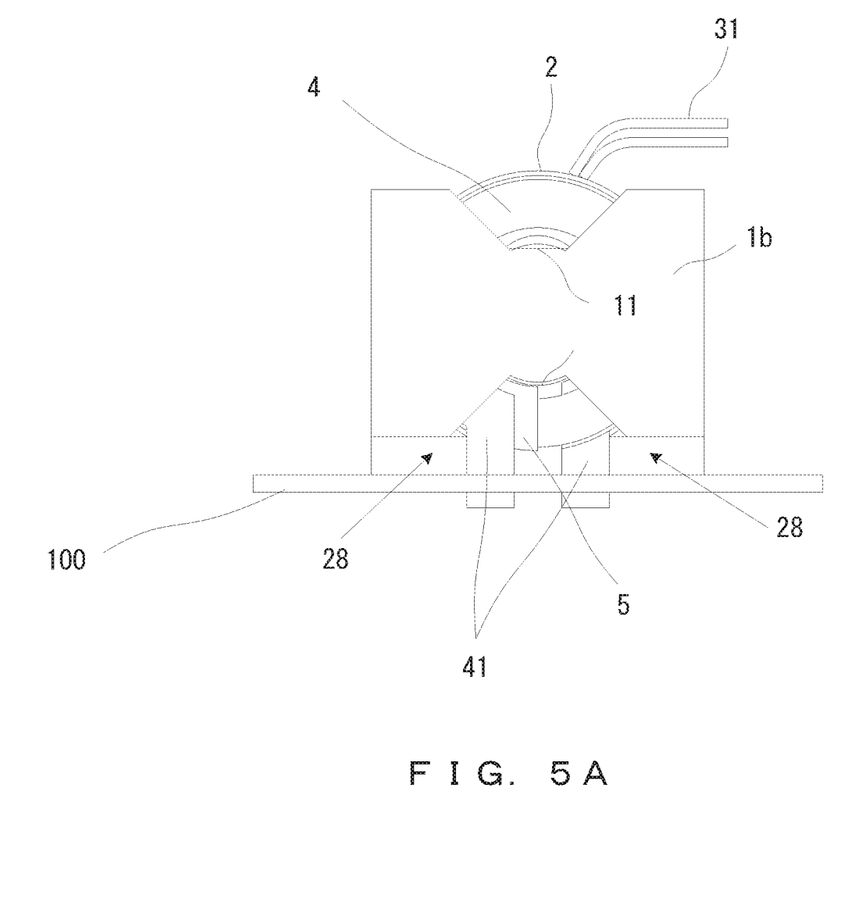
FIG. 5A illustrates a front view of the high-frequency transformer of FIG. 2.
Figure 5B:
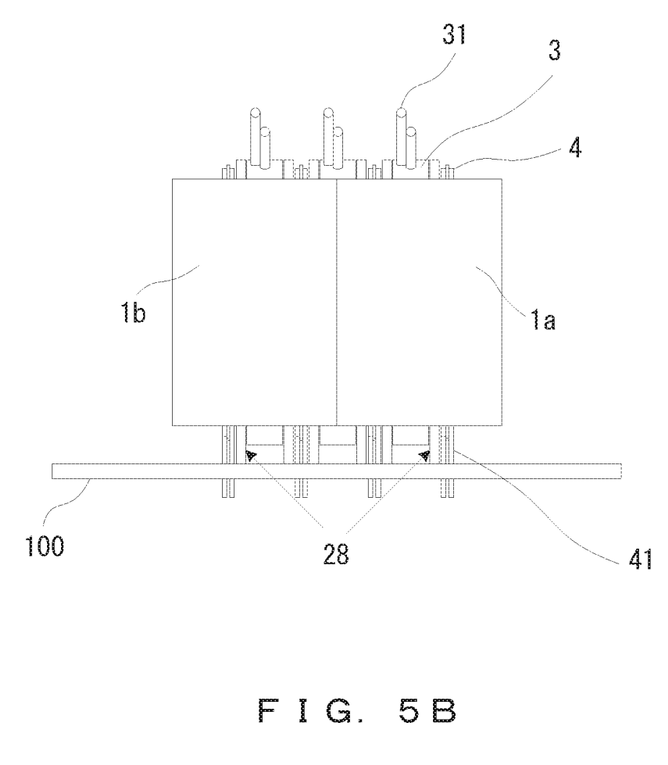
FIG. 5B illustrates a side view of the high-frequency transformer of FIG. 2.

As illustrated in FIGS. 5A and 5B, the transformer 1 is implemented on a printed circuit board 100. The primary winding may hereinafter include a primary winding integrally formed with a bobbin 2.

In FIG. 1, the cores 1a and 1b in pairs are PQ-type ferrite cores. The core 1a includes a column-shaped inner leg 1ab, a pair of outer legs 1ac, and a connection 1aa that connects the inner leg 1ab to the pair of outer legs 1ac.

A space formed between the pair of outer legs 1ac and the inner leg 1ab is a winding accommodating section 1ad that accommodates the primary windings 3 and the secondary windings 4.

Likewise, the core 1*b* includes a column-shaped inner leg 1*bb*, a pair of outer legs 1*bc*, and a connection 1*ba* that connects the inner leg 1*bb* to the pair of outer legs 1*bc*. A space formed between the pair of outer legs 1*bc* and the inner leg 1*bb* is a winding accommodating section 1*bd* that accommodates the primary windings 3 and the secondary windings 4.

An electrical wire is wound around the bobbin 2 a predetermined number of times so that the primary winding 3 is integrally configured with the bobbin 2.

The bobbin 2 is formed of resin material, and includes a cylindrical portion 21 having a hollow 22, and circular-flat-plate-shaped flanges 23 that respectively extend from two ends of the cylindrical portion 21. The flange 23 of the bobbin 2 is formed to have a height greater than the width of the cylindrical portion 21.

In other words, the bobbin 2 has a thin circular flat plate shape and is formed to be in the shape of a spool that includes the flanges 23 each having a height larger than the width of the cylindrical portion 21.

Further, the bobbin 2 includes rectangular support portions 28 that come into contact with a surface of the printed circuit board 100 in the respective opposite positions of the flanges 23. The thickness of the support portion 28 is equal to the thickness of the flange 23, and the width of the support portion 28 is greater than the diameter of the flange 23. A lower edge of the support portion 28 (a portion that comes into contact with the printed circuit board 100) is situated below a lower edge of the circumference of the flange 23. The bobbin 2 in the shape described above can easily be molded by pouring resin material into a mold. Further, the bobbin 2 can also be formed by milling it from resin material.

A high voltage is applied to the primary winding, so the bobbin 2 is formed of resin material having a low dielectric constant and high insulating properties.

The primary winding 3 is wound around the cylindrical portion 21 of the bobbin 2. A winding height of the primary winding 3 wound a predetermined number of times is smaller than the height of the flange 23. In a space formed by the cylindrical portion 21 and the flanges 23, the primary winding 3 is covered with an insulating resin material so as to be hermetically sealed with it.

This permits the primary winding 3 and the bobbin 2 to be easily integrally formed. It is preferable that resin material with which the primary winding 3 is sealed hermetically be a material identical to the resin material of which the bobbin 2 is formed.

In FIG. 1, the primary winding wound around the bobbin 2 is covered with the flanges 23 of the bobbin 2 and the resin with which the primary winding has been sealed hermetically, and is not situated outside of the bobbin 2. Primary-winding leads 31 are led through the beginning of winding and the end of winding of the primary winding.

Figure 3:
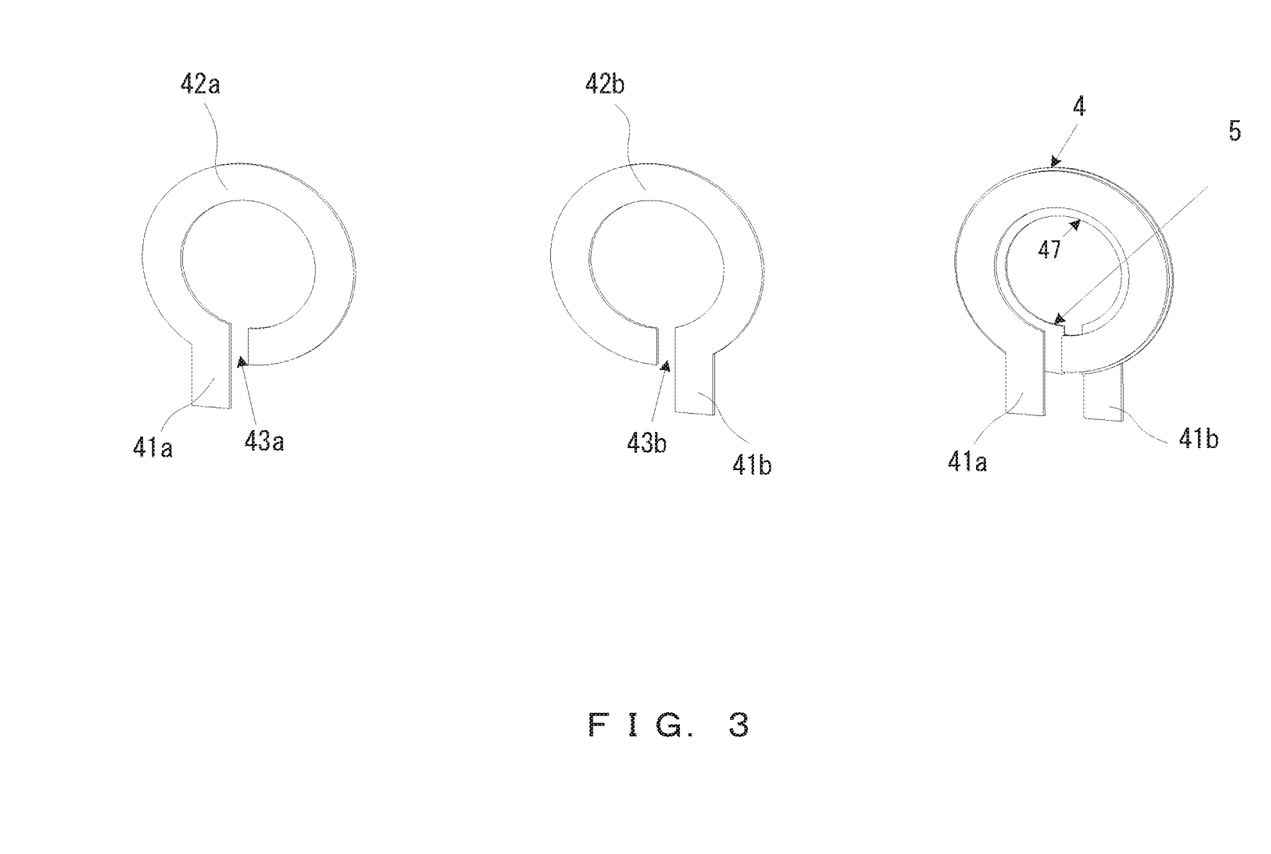
FIG. 3 illustrates an example of a configuration of a secondary winding according to the embodiments of the present invention (Part 1)

FIG. 3 illustrates an example of a configuration of the secondary winding 4 (Part 1).

The secondary winding 4 is constituted of two ring-shaped conductor plates having a thickness of a few hundred [μm] and each including a hollow 47. The two conductor plates respectively include a ring 42*a* and a lead 41*a*, and a ring 42*b* and a lead 41*b*, wherein the ring 42*a*, 42*b* includes a gap 43*a*, 43*b* and the lead 41*a*, 41*b* is provided at one of the ring ends forming the gap 43*a*, 43*b*.

Then the rings 42*a* and 42*b* are superimposed on each other such that the leads 41*a* and 41*b* of the two rings do not overlap, and the other ends of the rings 42*a* and 42*b* are then soldered together.

Accordingly, a spiral secondary winding 4 with two turns is configured. An insulating paper 5 is inserted between the two conductor plates.

The conductor plate in the ring shape described above can easily be manufactured by, for example, die-cutting a metal plate such as a copper plate having a high electrical conductivity, using, for example, a press.

The example in which the number of conductor plates that configure the secondary winding 4 is two has been described above, but this is just an example, and the number of conductor plates may be one or more than two.

Next, the configuration of the transformer 1 illustrated in FIG. 1 is described below.

The primary winding 3 and the secondary winding 4 are arranged in a layered formation alternately, in order of the secondary winding 4, the primary winding 3, the secondary winding 4, the primary winding 3, the secondary winding 4, the primary winding 3, and the secondary winding 4, wherein the hollows 22 and 47 align.

The cores 1*a* and 1*b* are arranged such that the pairs of outer legs 1*ac* and 1*bc* face each other and the inner legs 1*ab* and 1*bb* face each other, wherein the primary windings 3 and the secondary windings 4 that are arranged in a layered formation are situated between the cores 1*a* and 1*b*.

The inner legs 1*ab* and 1*bb* of the cores 1*a* and 1*b* are inserted into the hollow 47 of the secondary winding 4 and the hollow 22 of the bobbin 2 integrally formed with the primary winding 3, and their end faces are in contact with each other. The bottom faces of the pairs of outer legs 1*ac* and 1*bc* of the cores 1*a* and 1*b* are placed on the upper edges of the support portions 28 of the bobbin 2, and the end faces of the pairs of outer legs 1*ac* and 1*bc* of the cores 1*a* and 1*b* are in contact with each other.

In the transformer 1 configured as described above, a magnetic path is formed by the inner legs 1*ab* and 1*bb* and the pairs of outer legs 1*ac* and 1*bc* of the cores 1*a* and 1*b*, as illustrated in FIG. 2. Then, the primary winding 3 and the secondary winding 4 into which the inner legs 1*ab* and 1*bb* have been inserted are accommodated and fixed in the winding accommodating sections 1*ad* and 1*bd*.

The primary winding 3 is hermetically sealed with insulating resin within the bobbin 2. Thus, in FIG. 2, the primary winding 3 itself is not seen, and the resin with which the primary winding 3 has been sealed hermetically is seen.

The primary winding 3 includes the leads 31 which are led outside of the bobbin 2 from the hermetically sealed portion of the primary winding 3. In other words, the primary-winding lead 31 is led upward from an opening 11 on the upper side of the cores 1*a* and 1*b*.

Thus, heat generated in the primary winding 3 is transmitted to the primary-winding lead 31 and released to the outside air through the primary-winding lead 31. However, a current value that flows through the primary winding 3 is small, so an amount of heat generated in the primary winding 3 is small. Thus, there is a slight increase in temperature due to heat generation in a primary winding.

The lead 41 of the secondary winding is led downward from the opening 11 on the lower side of the pair of cores 1*a* and 1*b*. The lead 41 is soldered to the printed circuit board 100.

The position of the secondary winding 4 is fixed in the pair of cores 1*a* and 1*b* by the lead 41 being soldered to the printed circuit board 100.

The amount of heat generation in the secondary winding 4 through which a high current flows is large. The heat generated in the secondary winding 4 is released to the outside air through the lead 41 led below the cores 1a and 1b.

The configuration includes four separate secondary windings 4, so heat generation is dispersed and heat is released effectively at the leads 41 of each of the secondary windings 4. This results in suppressing a local overheating in the secondary winding 4.

Figure 4:
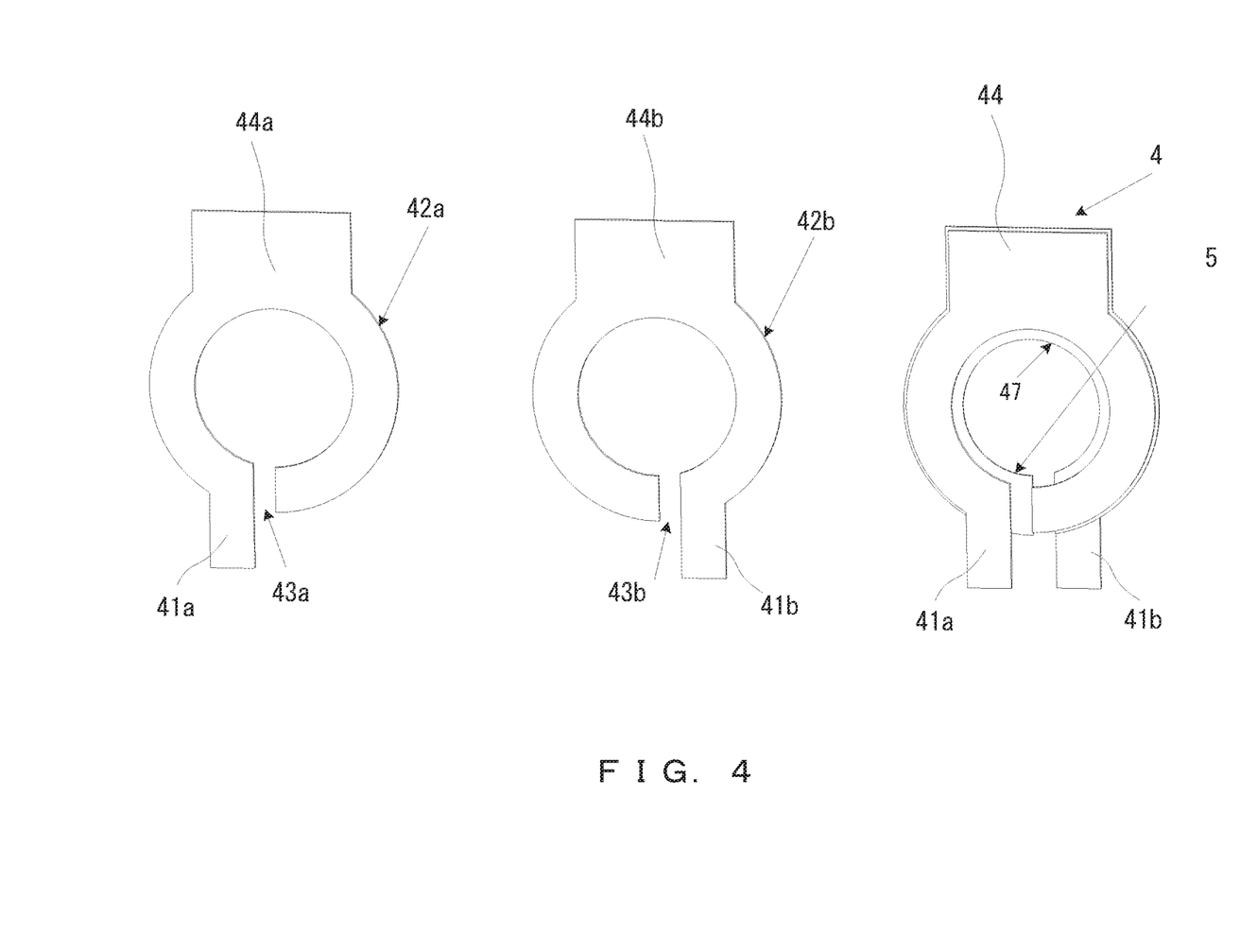
FIG. 4 illustrates an example of a configuration of the secondary winding according to the embodiments of the present invention (Part 2)

FIG. 4 illustrates an example of a configuration of the secondary winding 4 (Part 2).

This secondary winding 4 includes rectangular heat-releasing portions 44a and 44b in the respective upper portions of the rings 42a and 42b. The other aspects of its shape are similar to the secondary winding 4 illustrated in FIG. 3.

The heat-releasing portions 44a and 44b are respectively provided in the upper portions of the rings 42a and 42b, which results in releasing heat more effectively in the secondary winding 4.

Further, the primary-winding lead 31 is led above the transformer 1, and the secondary-winding lead 41 is led below the transformer.

Thus, the clearance and the creepage distance between the primary-winding lead 31 and the secondary-winding lead 41 are sufficiently ensured. As a result, the insulation between the primary-winding lead 31 and the secondary-winding lead 41 is sufficiently ensured.

Accordingly, the present invention can realize a high-frequency transformer that is small and is able to deal with a high frequency of operation (about few hundred [kHz]) and a high current output.

FIG. 5A illustrates a front view of the high-frequency transformer 1 implemented on the printed circuit board 100, as viewed from the front, and FIG. 5B illustrates a side view of the high-frequency transformer 1 implemented on the printed circuit board 100, as viewed from the side.

The secondary-winding lead 41 is soldered to the printed circuit board 100 and fixed on it.

The lower edges of the support portions 28 of the bobbin 2 come into contact with the surface of the printed circuit board 100, and support the weight (load) of the transformer. In the embodiment shown in FIGS. 5A and 5B, the width of the support portion 28 is equal to the width of the core 1a, 1b (the width of the two outer legs). If the width of the support portion 28 is equal to the width of the core 1a, 1b, the transformer 1 will be stably supported on the printed circuit board 100. However, the width of the support portion 28 does not always have to be equal to the width of the core 1a, 1b, but the width of the support portion 28 may be greater or less than the width of the core 1a, 1b as long as it can support the transformer 1 stably.

Further, the bottom faces of the pairs of outer legs 1ac and 1bc of the cores 1a and 1b are placed on the upper edges of the support portions 28. The support portions 28 of the bobbin 2 are configured such that the lower edges of the support portions 28 (portions that come into contact with the printed circuit board 100) are situated below the hermetically sealed portion of the primary winding 3. Thus, there exists a space between the surface of the printed circuit board 100 and the hermetically sealed portion of the primary winding 3. This makes it possible to stably support the transformer 1 with the support portions 28.

The load of the transformer 1 is supported by the support portions 28 coming into contact with the printed circuit board 100, which makes it possible to make the secondary winding 4 thinner. In other words, this configuration makes it possible to make the frequency of the transformer 1 higher and to make the transformer 1 smaller.

In the embodiment described above, the high-frequency transformer in which a high voltage is applied to the primary winding 3 and a low voltage is output from the secondary winding has been described as an example, in order to explain the support structure of the transformer 1.

However, the present invention is not limited to the high-frequency transformer described above. In other words, the present invention is applicable to a high-frequency transformer in which a low voltage is applied to the primary winding 3 and a high voltage is output from a secondary winding.

In this case, the secondary winding 4 can be wound around the bobbin 2, and the bobbin 2 can include the support portions 28.

The present invention is applicable to a high-frequency transformer in which a high voltage is applied to the primary winding 3 and a high voltage is output from a secondary winding. In this case, the primary winding 3 and the secondary winding 4 can be wound around separate bobbins 2, and these bobbins 2 can each include the support portions 28.

In the present embodiment, the high-frequency transformer in which the primary and secondary windings are wound and provided in the inner legs of the PQ cores has been described as an example in order to explain the support structure of the transformer 1.

However, the present invention is not limited to the high-frequency transformer configured using the PQ cores. In other words, the present invention is applicable to a high-frequency transformer configured using cores in another form such as EE cores or EI cores.

Further, the present invention is not limited to the high-frequency transformer in which the primary and secondary windings are wound and provided in the inner legs of the cores. In other words, the present invention is applicable to a high-frequency transformer in which primary and secondary windings are wound around legs that form a magnetic path, such as outer legs of cores.

Furthermore, the high-frequency transformer has been described as an example in order to explain the support structure of the transformer 1. However, the present invention is not limited to the support structure of a transformer.

In other words, the present invention is applicable to an inductor configured by providing, in cores, a bobbin around which windings are wound.

According to the embodiment described above, it is possible to realize a high-frequency transformer that is small and is able to deal with a high frequency of operation (about a few hundred [kHz]) and a high current output, because a bobbin includes support portions coming into contact with a printed circuit board and the support portions support and fix a transformer implemented on the printed circuit board, which makes it possible to make the thickness of copper-plate constituting a secondary winding thinner.

The high-frequency transformer of the present invention can be used in various small to large high-frequency transformers or various transformers.

What is claimed is:
1. A high-frequency transformer implemented on a printed circuit board, the high-frequency transformer comprising:
 a pair of cores that each include legs that define a magnetic path;

a plurality of primary windings and a plurality of secondary windings that are wound around the legs of the pair of cores; and a plurality of bobbins, each including two support portions and being formed of a first insulating resin material, the plurality of primary windings being respectively wound around the plurality of bobbins, each primary winding being hermetically sealed within the respective bobbin by a second insulating resin material, wherein each of the primary windings includes two primary-winding leads that are respectively connected to a beginning and an end of said each primary winding, and that extend out of the second insulating resin material that hermetically seals said each primary winding, so as to release heat generated therein, the support portions of the bobbins are in contact with, and supported by, the printed circuit board, each of the plurality of secondary windings includes two leads that are connected to the printed circuit board, the bobbins and the secondary windings are arranged alternately, the leads of the secondary windings and the support portions of the bobbins are formed on a first side of the transformer, and the primary-winding leads of the primary windings are formed on a second side of the transformer that is opposite to the first side.

2. The high-frequency transformer according to claim 1, wherein each of the secondary windings includes two die-cut metal plate rings.

3. The high-frequency transformer according to claim 2, wherein each of the secondary windings is configured to include a heat-releasing portion in the upper portion of the rings, and the two leads are respectively formed in the lower portion of the rings.

4. The high-frequency transformer according to claim 1, wherein each of the bobbins includes a cylindrical portion, flanges, and a hollow.

5. The high-frequency transformer according to claim 2, wherein each of the bobbins includes a cylindrical portion, flanges, and a hollow.

6. The high-frequency transformer according to claim 3, wherein each of the bobbins includes a cylindrical portion, flanges, and a hollow.

7. The high-frequency transformer according to claim 1, wherein the first insulating resin material is the same as the second insulating resin material.

8. A high-frequency transformer, comprising:

at least one core having a first leg having a cylindrical shape and a second leg, the first leg and second leg defining a magnetic path;

a plurality of primary windings and a plurality of secondary windings surrounding the first leg and at least partially surrounded by the second leg; and a plurality of bobbins, each including two support portions and being formed of a first insulating resin material, the plurality of primary windings being respectively wound around the plurality of bobbins, each primary winding being hermetically sealed within the respective bobbin by a second insulating resin material, wherein each of the primary windings includes two primary-winding leads that are respectively connected to a beginning and an end of said each primary winding, and that extend out of the second insulating resin material that hermetically seals said each primary winding, so as to release heat generated therein, the support portions of the bobbins are configured to be mounted on a printed circuit board, each of the plurality of secondary windings includes two leads that are connected to the printed circuit board, the bobbins and the secondary windings are arranged alternately, the leads of the secondary windings and the support portions of the bobbins are formed on a first side of the transformer, and the primary-winding leads of the primary windings are formed on a second side of the transformer that is opposite to the first side.

9. The high-frequency transformer according to claim 8, wherein the first leg and the second leg define a hollow having a shape of a partial cylinder, the first leg defining an inward side of the partial cylinder.

10. The high-frequency transformer according to claim 8, wherein each of the bobbins has a cylindrical portion mounted around the first leg.

11. The high-frequency transformer according to claim 10, wherein each of the bobbins further includes two flanges, between which one of the primary windings is wound.

12. The high-frequency transformer according to claim 8, wherein each of the secondary winding includes two die-cut metal plate rings mounted around the first leg and adjacent to one of the primary windings.

13. The high-frequency transformer according to claim 8, wherein the at least one core includes a pair of cores, and the plurality of primary windings and the plurality of secondary windings are mounted on the first leg and arranged alternatingly along an axial length direction of the first leg.

14. The high-frequency transformer according to claim 8, wherein the first insulating resin material is the same as the second insulating resin material.

* * * * *